United States Patent
Kang et al.

(10) Patent No.: US 10,185,174 B2
(45) Date of Patent: Jan. 22, 2019

(54) THIN FILM TRANSISTOR SUBSTRATE, DISPLAY DEVICE INCLUDING THE SAME, AND METHOD OF MANUFACTURING THIN FILM TRANSISTOR SUBSTRATE

(71) Applicant: Samsung Display Co., Ltd., Yongin-si (KR)

(72) Inventors: Hoon Kang, Suwon-si (KR); Bum Soo Kam, Yongin-si (KR); Sung Won Doh, Hwaseong-si (KR); Chong Sup Chang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/078,426

(22) Filed: Mar. 23, 2016

(65) Prior Publication Data

US 2017/0097543 A1    Apr. 6, 2017

(30) Foreign Application Priority Data

Oct. 5, 2015    (KR) .................. 10-2015-0139747

(51) Int. Cl.
| | |
|---|---|
| *H01L 21/00* | (2006.01) |
| *G02F 1/1335* | (2006.01) |
| *H01L 27/12* | (2006.01) |

(52) U.S. Cl.
CPC .. *G02F 1/133528* (2013.01); *G02F 1/133536* (2013.01); *H01L 27/124* (2013.01); *H01L 27/1262* (2013.01); *G02F 2001/133548* (2013.01)

(58) Field of Classification Search
CPC .............. H01L 27/124; H01L 27/1262; G02F 1/133536
See application file for complete search history.

(56) References Cited

U.S. PATENT DOCUMENTS

| | | | | |
|---|---|---|---|---|
| 9,645,439 | B2 * | 5/2017 | Kang | ................ G02F 1/133533 |
| 9,645,456 | B2 * | 5/2017 | Lee | ...................... G02F 1/13452 |
| 2006/0262250 | A1 * | 11/2006 | Hobbs | .................. G02B 5/1809 |
| | | | | 349/96 |
| 2013/0033662 | A1 * | 2/2013 | Chung | .............. G02F 1/133528 |
| | | | | 349/96 |

FOREIGN PATENT DOCUMENTS

| | | |
|---|---|---|
| KR | 10-2005-0097227 | 10/2005 |
| KR | 10-0654851 | 11/2006 |
| KR | 10-2008-0009280 | 1/2008 |
| KR | 10-0886039 | 2/2009 |
| KR | 10-2012-0076969 | 7/2012 |
| KR | 10-2013-0071697 | 7/2013 |
| KR | 10-2014-0107091 | 9/2014 |
| KR | 10-2015-0000743 | 1/2015 |

* cited by examiner

*Primary Examiner* — Richard A Booth
(74) *Attorney, Agent, or Firm* — H.C. Park & Associates, PLC

(57) ABSTRACT

A thin film transistor substrate, a display device including the same, and a method of manufacturing a thin film transistor substrate. The thin film transistor substrate includes: a base plate including a first area and a second area; a nano uneven pattern formed on one side of the base plate in the first area; a wire grid pattern formed on the ne side of the base plate in the second area; a gate electrode disposed on and overlapping the wire grid pattern; and one of a source electrode and a drain electrode disposed on the gate electrode and overlapping the wire grid pattern.

13 Claims, 8 Drawing Sheets

THIN FILM TRANSISTOR SUBSTRATE, DISPLAY DEVICE INCLUDING THE SAME, AND METHOD OF MANUFACTURING THIN FILM TRANSISTOR SUBSTRATE

CROSS-REFERENCE TO RELATED APPLICATION

This application claims priority from and the benefit of Korean Patent Application No. 10-2015-0139747, filed on Oct. 5, 2015, which is hereby incorporated by reference for all purposes as if fully set forth herein.

BACKGROUND

Field

Exemplary embodiments relate to a thin film transistor substrate, a display device including the same, and a method of manufacturing a thin film transistor substrate.

Discussion of the Background

A liquid crystal display and an organic light emitting display are widely used flat panel display devices. For example, a liquid crystal display includes a display panel including two substrates provided with field generating electrodes, such as a pixel electrode and a common electrode, and a liquid crystal layer disposed between the two substrates; and a backlight unit providing light to the display panel.

The lower one of the substrates adjacent to the backlight unit may be provided with a large number of pixels and wirings for driving the pixels and receives a drive signal from the outside. The upper one of the substrates may be provided with a tape carrier package for supplying the drive signal to the wirings and a printed circuit board.

A flat panel display device uses an upper chassis and a lower chassis as a case in order to couple the display panel and the backlight unit. For example, when the backlight unit is housed in the lower chassis, the display panel is placed thereon, and the printed circuit board provided with a drive circuit is bent in the direction of backside of the backlight unit. In this case, the upper chassis has a quadrangular band shape and covers the non-display area of the display panel to form a bezel. However, such a structure makes it difficult to provide narrow bezel structure in a flat panel display.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thin film transistor substrate, which can realize a flat panel display device having a narrower bezel structure, and a method of manufacturing the same.

Exemplary embodiments provide a display device, which has a narrow bezel structure and simultaneously can improve the contrast ratio of the displayed image.

Additional aspects will be set forth in the detailed description which follows, and, in part, will be apparent from the disclosure, or may be learned by practice of the inventive concept.

An exemplary embodiment discloses a thin film transistor substrate, including: a base plate including a first area and a second area; a nano uneven pattern formed on one side of the base plate in the first area; a wire grid pattern formed on the one side of the base plate in the second area; a gate electrode disposed on and overlapping the wire grid pattern; and one of a source electrode and a drain electrode disposed on the gate electrode and overlapping the wire grid pattern.

An exemplary embodiment also discloses a display device, including: a first base plate including a pixel area including an opening area and a light-blocking area; a nano uneven pattern formed on one side of the first base plate in the opening area; a wire grid polarizer formed on the one side of the first base plate in the light-blocking area; a second base plate spaced apart from and facing the one side of the first base plate; a liquid crystal layer interposed between the first base plate and the second base plate; and a backlight unit disposed under the second base plate.

An exemplary embodiment also discloses a method of manufacturing a thin film transistor substrate, including: preparing a base plate, which is provided with a first area and a second area, and in which a nano uneven pattern is formed on one side of the base plate in the first area, and a wire grid pattern is disposed on the one side of the base plate in the second area; forming a gate electrode on and overlapping the wire grid pattern; and forming one of a source electrode and a drain electrode on the gate electrode to overlap the wire grid pattern.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
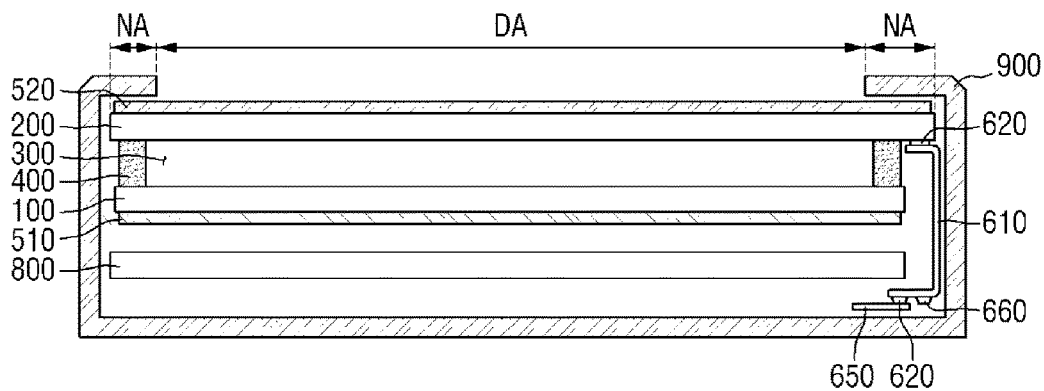
FIG. 1 is a side cross-sectional view of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments of the present invention will be described in detail with reference to the attached drawings.

Figure 2:
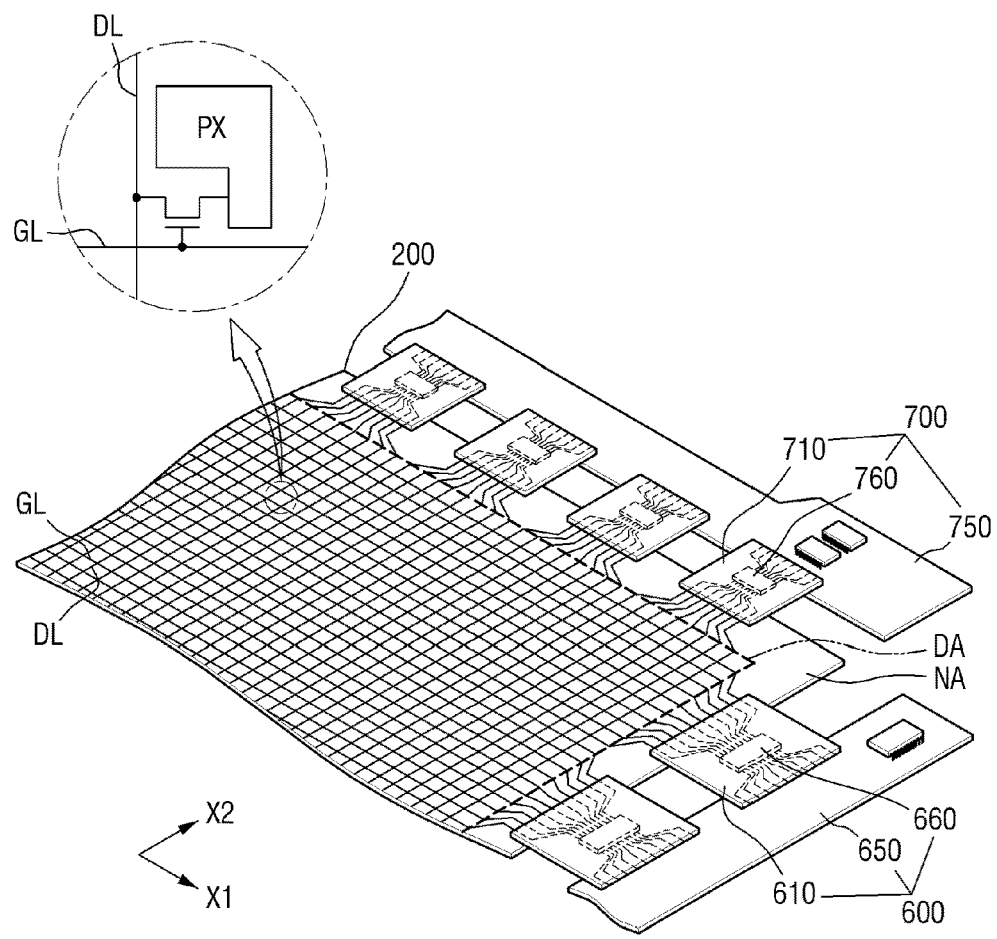
FIG. 2 is a bottom perspective view of a part of the upper substrate of FIG. 1.

FIG. 1 is a side cross-sectional view of a display device according to an embodiment of the present invention, and FIG. 2 is a bottom perspective view of a part of the upper substrate of FIG. 1.

A display panel including a lower substrate 100 and an upper substrate 200 may be exemplified as a liquid crystal display panel, an electrophoretic display panel, an organic light emitting display panel, and a plasma display panel, each of which is a module for displaying an image. Hereinafter, a liquid crystal display device will be described as an example of the display device according to an exemplary embodiment of the present invention. However, the display panel is not limited to a liquid crystal display panel, and various types of display panels and display devices may be used, which will be clearly understood to those skilled in the art.

Referring to FIGS. 1 and 2, the display device includes: a display panel including a lower substrate 100, an upper substrate 200 spaced apart from the lower substrate 100 and facing the lower substrate 100, a liquid crystal layer 300 interposed between the lower substrate 100 and the upper substrate 200, and a seal pattern 400 disposed on the outer periphery of the lower and upper substrate 100, 200 configured to attach substrates 100 and 200 to each other; a lower polarizing plate 510 and an upper polarizing plate 520 respectively disposed beneath and on the display panel; a backlight unit 800 disposed under the lower polarizing plate 510; and a case 900 for packaging the display panel, the lower and upper polarizing plates 510 and 520, and the backlight unit 800.

The upper substrate 200 may be a thin film transistor substrate, and the lower substrate 100 may be a counter substrate disposed to be spaced apart from and overlap the upper substrate 200. The upper substrate 200 may have a larger plane area than the lower substrate 100, and a part of the upper substrate 200 not overlapping the lower substrate 100 may be provided with a pad area for connecting a gate drive circuit 600 and a data drive circuit 700.

The lower substrate 100 and upper substrate 200 of the display panel each include a display area DA and a non-display area NA. The display area DA is an area in which an image is recognized, and the non-display area NA is an area in which an image is not recognized. The outer periphery of the display area DA is surrounded by the non-display area NA.

The display area DA includes a plurality of gate lines GL disposed on the lower surface of the upper substrate 200 and extended in the first direction (X1 direction), a plurality of data lines DL disposed on the lower surface of the upper substrate 200 and extended in the second direction (X2 direction) crossing the first direction (X1 direction), and a plurality of pixels PX formed in an area in which the gate lines GL and the data lines DL cross each other. The pixels PX may be arranged in the first and second directions to be substantially disposed in a matrix.

Each of the pixels PX can uniquely display one of the primary colors in order to realize color display. Examples of the primary colors include red, green, and blue.

A part of the case 900, for example, a front chassis, overlaps the non-display area NA to block light. The non-display area NA of the display panel includes a pad area for mounting drive circuit units, such as flexible circuit units 600, 700, to provide a gate signal and a data signal, respectively, to the pixels PX of the display area DA, and a seal pattern 400 for attaching the lower substrate 100 and the upper substrate 200.

Further, at least a part of the non-display area NA of the upper substrate 200 may be attached to a gate drive circuit unit 600 and a data drive circuit unit 700 through a pad electrode. Here, the gate drive circuit unit 600 includes a tape carrier package (TCP) 610, a printed circuit board (PCB) 650 mounted with circuit parts for driving the display panel, a drive integrated circuit 660 mounted on the tape carrier package 610 by tape automated bonding (TAB), and a conductive member 620 for connecting the upper substrate 200 and the tape carrier package 610 or connecting the tape carrier package 610 and the printed circuit board 650. The data drive circuit unit 700 includes a tape carrier package (TCP) 710, a printed circuit board (PCB) 750 mounted with circuit parts for driving the display panel, a drive integrated circuit 760 mounted on the tape carrier package 710 by tape automated bonding (TAB), and a conductive member 620 for connecting the upper substrate 200 and the tape carrier package 710 or connecting the tape carrier package 710 and the printed circuit board 750.

The conductive member 620 may be an anisotropic conductive film (AFC), which is an adhesive member containing conductive particles. For example, when both sides (upper and lower sides) of the conductive member 620 are pressed, the distance between adjacent conductive particles dispersed therein is reduced to such a degree that the conductive particles communicate with each other, and thus both pressed sides thereof can be electrically connected with each other.

The tape carrier package 610 or 710 may electrically connect the upper substrate 200 and the printed circuit board 650 or 750 through the conductive member 620. The tape carrier package 610 or 710 is made of a flexible material containing polyimide to be bent toward the backside of the backlight unit 800, so as to minimize the volume of the drive units in the display device. Further, the tape carrier package 610 or 710 is mounted on one side thereof with the drive integrated circuit 660 or 760.

FIGS. 1 and 2 show a chip-on-film (COF) structure in which the drive integrated circuit 660 or 760 is disposed on the tape carrier package 610 or 710. However, in some exemplary embodiments, a chip-on-glass (COG) structure, in which one or more of a gate drive integrated circuit and a data drive integrated circuit are directly disposed in the non-display area of the upper substrate 200 without additional structures, a structure in which one or more of a gate drive integrated circuit and a data drive integrated circuit are directly printed in the non-display area of the upper substrate 200, or a combination thereof may be used.

The lower polarizing plate 510 is disposed beneath the lower substrate 100, and the upper polarizing plate 520 is disposed on the upper substrate 200. A detailed description of the lower and upper polarizing plates 510 and 520 will be described later.

The backlight unit 800 is disposed under the display panel and the lower polarizing plate 510, and is configured to apply light toward the display panel. The backlight unit 800 may include a light source (not shown), a light guide plate (not shown) transferring the light emitted from the light source toward the display panel, a reflective sheet (not shown) disposed under the light guide plate, and at least one optical sheet (not shown) disposed over the light guide plate to improve the brightness characteristics of the light proceeding toward the display panel.

The case 900 may include a lower chassis and an upper chassis.

The lower chassis may include a rear chassis, and a side wall extended from the external end of the rear chassis toward the upper side thereof to fix the backlight unit 800. That is, the lower chassis may be a box-shaped structure having a space for accommodating the backlight unit 800, which is formed by integrating the rear chassis with the side wall in an L shape.

The upper chassis has a quadrangular band-shaped structure including a lateral chassis for introducing the side wall of the lower chassis and a front chassis extended from the upper end of the lateral chassis to the inside of the display panel. That is, the upper chassis is formed by integrating the front chassis with the lateral chassis so as to allow the lateral chassis to cover the side wall of the lower chassis and the lateral side of the display panel and allow the front chassis to cover the non-display area NA of the display panel, thereby forming a bezel.

In the display device according to an exemplary embodiment of the present invention, one end of the tape carrier package 610 or 710 of the gate circuit unit 600 or the date gate circuit 700 is attached to the upper substrate 200 to allow the tape carrier package 610 or 710 to be penetrated between the lateral side of the lower substrate 100 having a smaller area than the upper substrate 200 and the lateral side of the case 900. Thus, the tape carrier package 610 or 710 is directly bent from the non-display area NA of the upper substrate 200 to the backside of the backlight unit 800, so that the area of a bezel in the display device can be reduced as compared to the arrangement where the tape carrier package 610 or 710 is bent by bypassing a substrate having a large plane area. Further, when the tape carrier package 610 or 710 is bent by bypassing the substrate, there is a disadvantage in that the degree of bandage of the tape carrier package 610 or 710 is great, and the tape carrier package 610 or 710 is pressed between the case 900 and one side of the substrate to be vulnerable to external impacts, but is advantageous in that, in the display device according to the present invention, the tape carrier package 610 or 710 can be placed in a space of sufficient size.

Hereinafter, a pixel constituting the display device according to an exemplary embodiment will be described.

Figure 3:
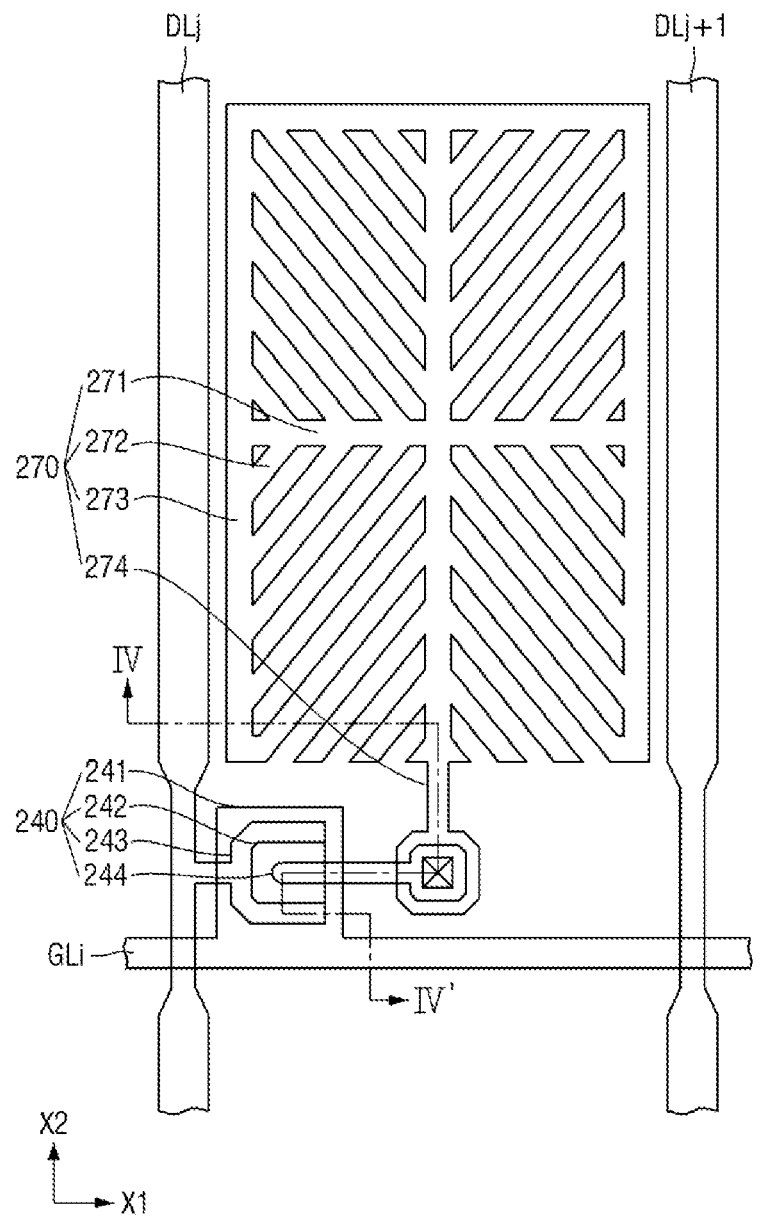
FIG. 3 is a plan view of a pixel of the display device of FIG. 1.
Figure 4:
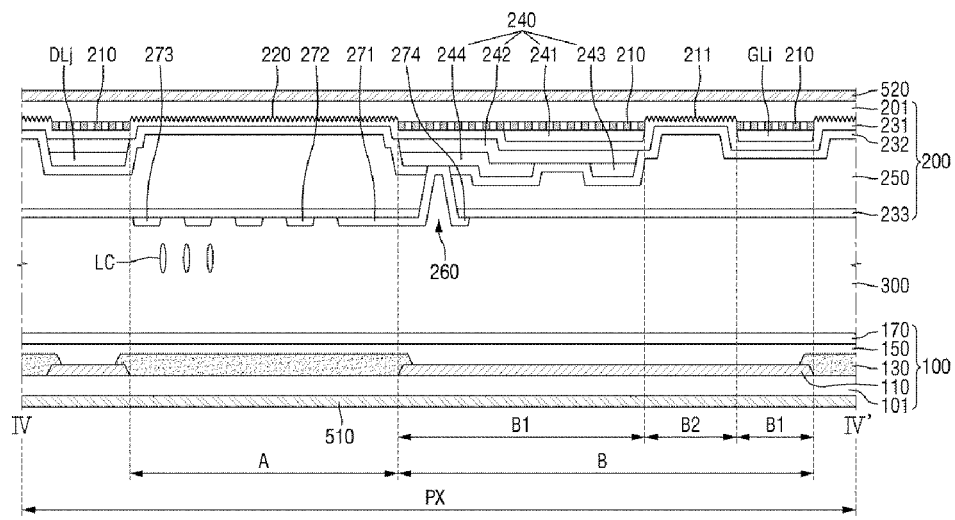
FIG. 4 is a cross-sectional view taken along the line IV-IV' of FIG. 3.

FIG. 3 is a plan view of a pixel of the display device of FIG. 1, and FIG. 4 is a cross-sectional view taken along the line IV-IV' of FIG. 3. The pixel area PX for the pixel includes an opening area A, which is not provided with a light-blocking member such that light is substantially transmitted therethrough at the time of driving the display device, and a light-blocking area B which is provided with the light-blocking member 110. The light-blocking area B includes a metal wiring area B1 provided with a metal electrode, a gate line, and a data line, and a light-blocking area B2 not provided with a metal wiring.

Referring to FIGS. 3 and 4, the lower substrate 100 may include a first base plate 101, a light-blocking member 110, a color filter 130, an overcoat layer 150, a common electrode 170, and a first alignment film (not shown).

The first base plate 101, which is a transparent insulating plate, may be made of a material having excellent transmissivity, heat resistance, and chemical resistance. For example, the first base plate 101 may be a silicon plate, a glass plate, or a plastic plate.

The light-blocking member 110 is disposed on the first base plate. The light-blocking member 110 may be a black matrix. The light-blocking member 110 may be disposed in boundary areas between the plurality of pixel areas PX, that is, an area overlapping data lines DLj and DLj+1 and an area overlapping a thin film transistor 240 and a gate line GLi, so as to prevent the light leakage occurring in the boundary areas between the plurality of pixel areas PX divided by the light-blocking member 110.

The color filter 130 may be disposed on the light-blocking member to overlap at least a part of the pixel area PX. The color filter 130 can selectively transmit light of a specific wavelength range. The color filter 130 may be disposed between the two adjacent data lines DLj and DLj+1. A plurality of color filters transmitting light of different wavelength ranges from each other with respect to each pixel area PX may also be disposed therebetween. For example, the first pixel area may be provided with a red color filter, and the second pixel area adjacent to the first pixel area may be provided with a green color filter. FIG. 4 shows a structure in which the color filter 130 is disposed in the lower substrate 100. However, in some exemplary embodiments, a structure in which the color filter 130 is disposed in the upper substrate 200, which is a thin film transistor substrate, may be used.

The overcoat layer 150 is disposed on the light-blocking member 110 and the color filter 130 over the entire surface of the first base plate 101. The overcoat layer 150 can prevent the light-blocking member 110 form being lifted from the first base plate 101, suppress a residual image due to pigment particles discharged from the color filter 130, and make uniform the heights of the components laminated on the first base plate 101.

The common electrode 170 is disposed on the overcoat layer 150. The common electrode may be a transparent electrode formed by patterning a metal layer. Examples of the material of the common electrode 170 may include, but are not limited to, indium tin oxide (ITO) and indium zinc oxide (IZO). The common electrode 170 may be disposed to overlap a major part of each pixel area PX. The common electrode 170 forms a fringe field together with a pixel electrode, to be described later, so as to control the liquid crystal molecules (LC) in the liquid crystal layer 300. The first alignment film (not shown) may be disposed on the common electrode 170 over the entire surface thereof, so as to control the liquid crystal molecules (LC) in the liquid crystal layer 300.

Subsequently, the upper substrate 200 will be described. The upper substrate 200 may include a second base plate 201, at least one thin film transistor 240, at least one pixel electrode 270, a plurality of protective films/insulating films, and a second alignment film (not shown).

The second base plate 201, similar to the first base plate 101, is a transparent insulating plate, and may have a refractive index of 1.3 to 1.6. A nano uneven pattern 220 is formed in a part of the light-blocking area B and the opening area A of one side of the second base plate 201. The nano uneven pattern 220 may be a slope-type structure in which a plurality of inclined surfaces is formed at regular intervals on one side of the second base substrate 201. A detailed description of the nano uneven pattern 220 will be described later with reference to FIG. 5.

A wire grid pattern 210 is disposed in at least a part of the light-blocking area B of the second base plate 201. One side of the light-blocking area B provided with the wire grid pattern 210 may be a flat surface. The polarizing axis of the wire grid pattern 210 may be disposed in a direction different from the polarizing axis of the upper polarizing plate 520, for example, in a direction perpendicular to the polarizing axis of the upper polarizing plate 520. A detailed description of the wire grid pattern 210 will be described later with reference to FIG. 6.

A gate wiring layer is disposed on the nano uneven pattern 220 and the wire grid pattern 210. The gate wiring layer includes a plurality of gate lines GLi and a gate electrode 241. The gate lines GLi is extended along the first direction (X1). The gate electrode 241 protrudes from the gate lines GLi to be integrated with the gate lines GLi without physical boundaries, and gate signals provided from the gate lines GLi may be applied to the gate electrode 241.

The gate wiring layer may be formed by forming a first metal layer, which contains any element selected from among Tantalum (Ta), tungsten (W), titanium (Ti), molybdenum (Mo), aluminum (Al), copper (Cu), silver (Ag), chromium (Cr), and neodymium (Ne), or an alloy material or compound material having the element as a main component, and then patterning the first metal layer. The patterning of the first metal layer may be performed using a mask process, and may also be performed other methods capable of forming a pattern. The gate wiring layer may have a multilayer structure.

A gate insulating film 231 is disposed on the gate wiring layer over the entire surface of the second base plate 201. The gate insulating film 231, which is disposed on the nano uneven pattern 220 in the opening area A, can be disposed on the inside of the nano uneven pattern 220. The gate insulating film 231 is made of an insulating material to electrically insulate a layer located thereon and a layer located therebeneath from each other. Examples of the material constituting the gate insulating film 231 may include silicon nitride ($SiN_x$), silicon oxide ($SiO_x$), silicon nitride oxide ($SiN_xO_y$), and silicon oxynitride ($SiO_xN_y$). The gate insulating film 231 may have a multilayer structure including at least two or more insulating layers different from each other in physical properties. The gate insulating film 234 may have a refractive index of 1.5 to 1.9.

A semiconductor layer 242 is disposed on the gate insulating film 231. At least a part of the semiconductor layer 242 may be disposed to overlap the gate electrode 241. The semiconductor layer 242 serves as a channel of a thin film transistor, and can turn on or off the channel according to the voltage applied to the gate electrode 241. The semiconductor layer 242 may be formed by patterning a semiconductor material layer containing a semiconductor material, such as amorphous silicon, polycrystalline silicon, or oxide semiconductor. FIG. 4 shows a case in which the semiconductor layer 242 is disposed in an area in which the semiconductor layer 242 overlaps a part of source/drain electrodes 243 and 244 and data lines DLj not overlapping the gate electrode 241. However, the semiconductor layer 242 may instead be formed only in an area in which the semiconductor layer overlaps the gate electrode 241.

A data wiring layer is disposed on the semiconductor layer 242. The data wiring layer includes a plurality of data lines DLj and DLj+1, a source electrode 243, and a drain electrode 244. The data lines DLj and DLj+1 is extended along the second direction (X2) to cross the gate lines GLi.

The source electrode 243 is spaced apart from the drain electrode 244, the gate electrode 241, and the semiconductor layer 242. The source electrode 243 may have a shape so as to surround a part of the drain electrode 244. For example, the source electrode 243 may have a C-shape, a U-shape, or a reverse C-shape, or a reverse U-shape. The source electrode 243 protrudes from the data lines DLi right to be integrated with the data lines DLi without physical boundaries, and data signals provided from the data lines DLi may be applied to the source electrode 243. The drain electrode 244 may be electrically connected with the pixel electrode 270 in the pixel area PX.

The data wiring layer may be formed by forming a second metal layer, which contains a refractory metal, such as silver (Ag), gold (Au), copper (Cu), nickel (Ni), platinum (Pt), palladium (Pd), iridium (Ir), rhodium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), or barium (Ba), or an alloy or nitride thereof, and then patterning the second metal layer. Further, the data wiring layer may have a multilayer structure.

An ohmic contact layer (not shown) may be additionally disposed between the semiconductor layer 242 and the data wiring layer. The ohmic contact layer may be made of a hydrogenated amorphous silicon material doped with n-type impurities or made of a silicide material. The above-described gate electrode 241, semiconductor layer 242, source electrode 243, and drain electrode constitute a thin film transistor, which is a three-terminal device.

A protection layer including a first protective film 232, a flattening layer 250, and a second protective film 233 may be disposed on the data wiring layer. The protection layer may be formed of an organic/inorganic film, and may have a single layer structure or a multilayer structure.

The first protective film 232 may be made of an inorganic insulating material, such as silicon nitride or silicon oxide. The first protective film 232 serves to prevent wiring layers and electrodes from directly making contact with an organic material. The flattening layer 250 may be disposed on the first protective film 232. The flattening layer 250 may be made of an organic material, and serves to make the heights of the plurality of components laminated on the second base plate 201 uniform. The second protective film 233 may be disposed on the flattening layer 250. The second protective film 233 serves to prevent the liquid crystal layer 300 from being contaminated by an organic material such as a solvent supplied from the fattening layer 250, so as to prevent a defect, such as a residual image occurring at the time of driving a screen.

A contact hole 260 is formed in the protection layer including the first protective film 232, the flattening layer 250, and the second protective layer 233 to expose a part of the drain electrode 244. The drain electrode 244 may be electrically connected with a pixel electrode 270, which will be described later, through the contact hole 260.

The pixel electrode 270 is disposed on the protection layer and the drain electrode 244 exposed by the contact hole 260. The pixel electrode 270 is disposed corresponding to each of a plurality of pixel areas. As described above, the pixel electrode 270 forms an electric field together with the common electrode 170 disposed in the lower substrate 100, so as to control the alignment direction of liquid crystal molecules (LC) in the liquid crystal layer 300 interposed between the pixel electrode 270 and the common electrode 170. The pixel electrode 270, similarly to the common electrode 170, may be a transparent electrode.

The pixel electrode 270 has an approximately-quadrangular shape, and may be a patterned electrode including a central electrode 271, a plurality of branch electrodes 272, a border electrode 273 interconnecting at least some of ends of the plurality of branch electrodes 272, and a protrusion electrode 274 protruding downwards.

Specifically, the central electrode 271 may be formed in an approximately cross shape, and the plurality of branch electrodes 272 may be radially extended from the central electrode 271 at an inclination angle of about 45°. That is, the pixel electrode 270 may have four domain areas which are divided by the central electrode 271 and in which directions of the branch electrodes 272 are different from each other. Each of the domain areas serves as a director of liquid crystal molecules (LC) to make the alignment directions of liquid crystal molecules (LC) different from each other at the time of driving the display device. Thus, while liquid crystal control is improved, a viewing angle increases, textures decreases, and transmittance and response speed are improved. At least some of ends of the radially extended branch electrodes 272 may be connected to each other through the border electrode 273 surrounding the periphery of the pixel electrode 270. Further, the protrusion electrode 274 is formed under the pixel electrode 270 to be electrically connected with the drain electrode 244 through the contact hole 260.

However, such a pixel electrode disposition is set forth to illustrate only one example. In some exemplary embodiments, some configurations may be added or omitted, the pixel electrode 270 may be disposed in a form bent with respect to the gate line and the data line, or the pixel electrode 270 may include a first sub-pixel, to which a relatively high voltage is applied, and a second sub-pixel, to which a relative low voltage is applied.

A second alignment film (not shown) is disposed on the pixel electrode 270 over the entire surface thereof, so as to align liquid crystal molecules (LC) in the liquid crystal layer 300.

The lower polarizing plate 510 is disposed beneath the lower substrate 100, and the upper polarizing plate 520 is disposed on the upper substrate 200. The transmission axes of the lower polarizing plate 510 and the upper polarizing plate 520 may be perpendicular to or in parallel with each other. In the liquid crystal display device according to an exemplary embodiment of the present invention, while the light emitted from a backlight unit (not shown) disposed under a display panel sequentially transmits the lower polarizing plate 510, the liquid crystal layer 300 including the liquid crystal molecules behaved by an electric field, and the upper polarizing plate 520, the polarized state of the transmitted light is controlled, thereby displaying an image on the display panel. In this case, the reflection of external light emitted from the display panel causes the deterioration in contrast of an image recognized by viewers, and thus, the suppression of the reflection of external light can contribute to the improvement of display quality.

Figure 5:
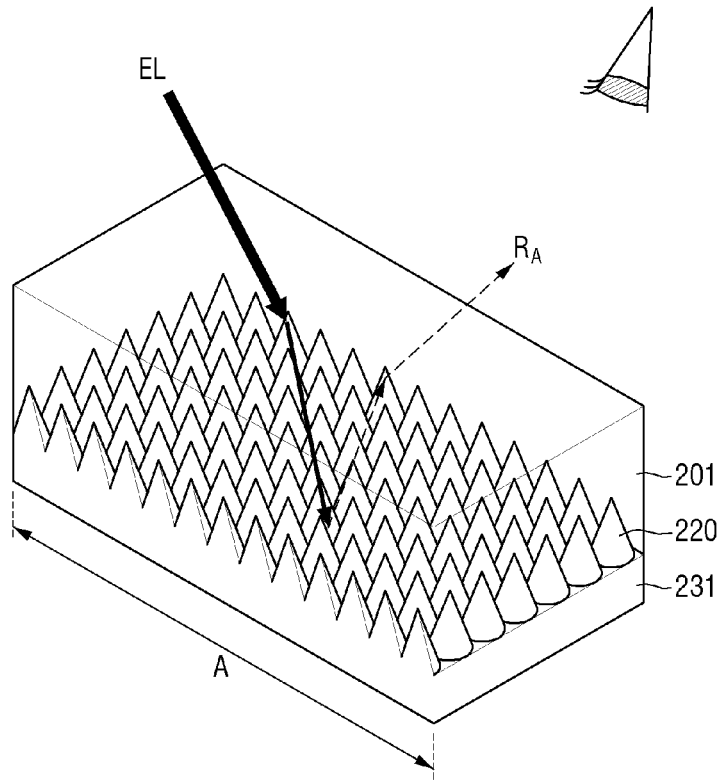
FIG. 5 is a schematic view showing a principle of minimizing the reflection of external light in the opening area of FIG. 4.

FIG. 5 is a schematic view showing a principle of minimizing the reflection of external light in the opening area of FIG. 4. It is known that a part of incident light is reflected at the interface between two media having refractive indices different from each other. This phenomenon can be explained by a Fresnel Equation. In this case, the reflectivity of reflected light to incident light sensitively depends on the difference in refractive index between the two media that form the interface.

Referring to FIG. 5, a nano uneven pattern 220 is formed on at least a part of one side at which the second base plate 201 in the opening area A of the display device according to the present invention is in contact with the gate insulating film 231. Specifically, the nano uneven pattern 220 is an engraved pattern recessed toward the inside (upper side in the drawing) of the second base plate 201, compared to one flat side of the light-blocking area B of the second base plate 201 provided with a wire grid pattern. The engraved pattern may have a cone shape in which diameter decreases toward the inside thereof. However, the engraved pattern can be applied without limitation as long as it has an inclined structure in which a large number of regular inclinations can be formed on one side of the second base plate 201. For example, the nano uneven pattern 220 may be an embossed pattern protruding from one side at which the second base plate 201 is in contact with the gate insulating film 231, and may have a truncated cone shape in which diameter decreases toward the inside thereof, a similar cone shape in which diameter decreases toward the inside thereof and a cross-section of an edge is a curve, or a polypyramid shape in which a bottom surface is a polygon. Illustratively, the maximum diameter of the nano uneven pattern 220 is 40 nm to 150 nm, the maximum depth thereof is 10 nm to 50 nm, and the maximum diameter of the nano uneven pattern 220 may be greater than the maximum depth thereof.

FIG. 5 shows a case of a matrix arrangement in which the nano uneven patterns 220 are repeatedly arranged in a first direction and a second direction perpendicular to the first direction, and a case of the plurality of nano uneven patterns 220 are directly adjacent to each other in the first direction and/or the second direction perpendicular to the first direction. However, the nano uneven patterns 220 may be repeatedly arranged in a first direction and a second direction diagonal to the first direction to have an oblique matrix arrangement, or the plurality of nano uneven patterns 220 adjacent to each other in the direction of the matrix arrangement may be arranged at predetermined intervals. In this case, the distance between the adjacent naon uneven patterns 220 may be 1 nm to 100 µm.

The nano uneven patterns 220 having such a structure forms a gradient refractive index, at which the refractive index of the interface between the second base plate 201 and the gate insulating film 231 is gradually or continuously changed, thereby removing the optical interface causing reflection. Therefore, the reflection ratio of reflected light RA recognized by viewers to external light EL emitted from the upper side of the display panel through the opening area A may be significantly reduced.

Further, because the difference in refractive index between the second base plate 201 and the gate insulating film 231 can be reduced without providing an additional layer, such as a buffer layer, therebetween, the thickness of the display panel does not increase, and the deterioration in transmittance due to the buffer layer does not occur.

Figure 6:
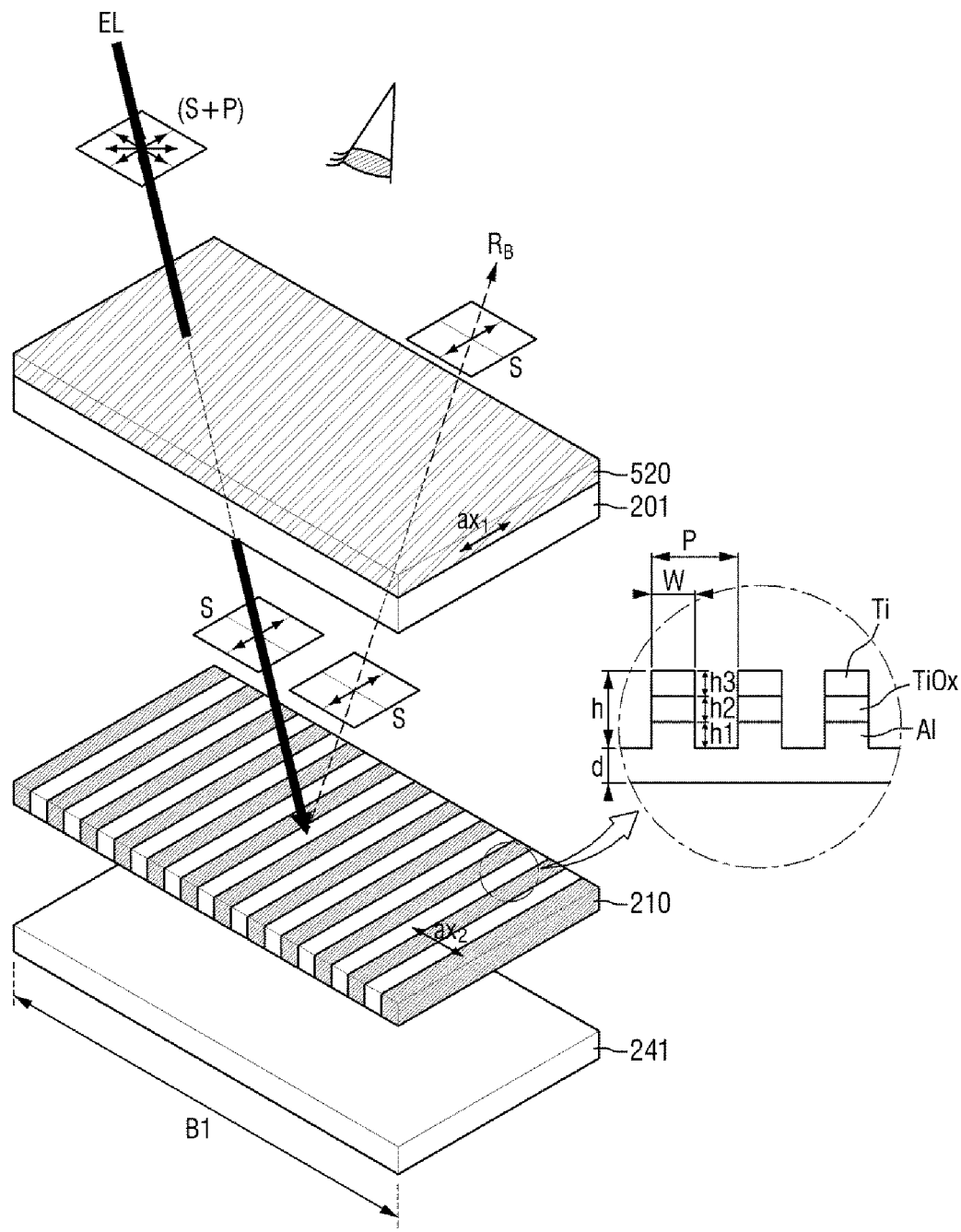
FIG. 6 is a schematic view showing a principle of minimizing the reflection of external light in the light-blocking area of FIG. 4.

FIG. 6 is a schematic view showing a principle of minimizing the reflection of external light in the light-blocking area of FIG. 4.

Referring to FIG. 6, in the light blocking area of the display device according to the present invention, specifically, in the metal wiring area B1 in which a gate line (not shown), a data line (not shown), and a metal layer, such as a metal electrode (for example, a gate electrode 241) constituting a thin film transistor are disposed, a wire grid pattern 210 is disposed between a second base plate 201 and the metal layer 210.

The wire grid pattern 210 is a pattern in which a large number of nanowires are arranged on a supporting member, for example, a substrate, in parallel with each other at regular intervals. It is known that a polarization separation phenomenon occurs when the pitch of the nanowires is smaller than the wavelength of incident light. Specifically, when the pitch of the nanowires is about 100 nm or less, light incident on the nanowires parallel thereto is absorbed or reflected on the wire grid pattern 210, and light incident on the nanowires perpendicular thereto is transmitted, so that the wire grid pattern 210 can be utilized as a polarizer. In this case, the transmission axis of the wire grid pattern 210 is perpendicular to the nanowires.

The nanowires of the wire grid pattern 210 may be made of any one metal material containing aluminum (Al), gold (Au), silver (Ag), copper (Cu), chromium (Cr), iron (Fe), nickel (Ni), molybdenum (Mo), and titanium (Ti); any one oxide of the metal material; or any one alloy of the metal material. Also, the nanowires of the wire grid pattern 210 may be a multilayer structure in which the metal material, the oxide thereof, and the alloy thereof are laminated.

The horizontal width (w) of the nanowires of the wire grid pattern 210 may be about 45 nm to 55 nm, the horizontal pitch (p) thereof may be about 140 nm to 150 nm, the vertical height (h) thereof may be about 170 nm to 190 nm, and the vertical thickness (d) of a connection connecting the nanowires to each other at least one vertical end of the nanowires may be about 60 nm to 70 nm. Unlike what is shown in FIG. 6, the connection may be omitted.

Illustratively, the nanowire of the wire grid pattern 210 may be a triple-layer structure in which aluminum (Al), titanium oxide ($SiO_x$), and titanium (Ti) are sequentially laminated from the lower layer thereof. The horizontal width (w) of the nanowire may be about 50 nm, the horizontal pitch (p) thereof may be about 144 nm, and the vertical height (h) thereof may be about 180 nm. Further, the vertical thickness (h2) of the titanium oxide layer of the laminated nanowires may be about ⅙ to ½ with respect to the horizontal height (h) of the nanowire. That is, the vertical thickness (h2) of the titanium oxide layer may be about 30 nm to 90 nm, about 40 nm to 80 nm, about 50 nm to 75 nm, or even about 65 nm to 71 nm. When the vertical thickness (h2) of the titanium oxide layer is about 70 nm, in incident light, most of polarized light in a direction different from the transmission axis (aX2) of the wire grid pattern 210 may be absorbed, and only about 1% of the polarized light may be reflected.

The transmission axis (aX2) of the wire grid pattern 210 according to the present invention may be placed in a direction different from the transmission axis (aX1) of the upper polarizing plate 520, for example, in a direction perpendicular to each other, and the wire grid pattern 210 may be an absorption type or low-reflection type wire grid polarizer.

When non-polarized external light EL is incident into the metal wring area B1 from the upper side of the display panel, the external light is polarized by the upper polarizing plate 520 to include only the polarization component (S polarized light) in one direction perpendicular to an incidence plane, passes through the second base plate 201, and then reaches the wire grid pattern 210 disposed between the second base plate 201 and the metal layer, for example, the gate electrode 241. Because the wire grid pattern 210 has a transmission axis different from that of the upper polarizing plate 520, the light having passed through the upper polarizing plate 520 cannot pass through the wire grid pattern 210, one part of the light may be absorbed by the wire grid pattern 210, and other part thereof may be reflected by the wire grid pattern 210. Thus, the external light EL reaches the metal layer, such as the gate electrode 214, and is then entirely reflected by high reflectivity of the metal itself, so as to minimize the recognition of the external light EL to viewers.

Moreover, the wire grid pattern 210 may be an absorption type or low-reflection type wire grid polarizer. As described above, when the nanowires of the wire grid pattern 210 are formed as a multilayer structure, a low reflection effect can be exhibited through the offset/interference effect of reflected light by controlling the materials constituting the nanowires and the interlayer thickness. Illustratively, the reflectivity of reflected light RB that may be recognized by viewers to the incident external light EL may be about 1% or less.

Hereinafter, display devices according to other exemplary embodiments of the present invention will be described. However, descriptions of configurations thereof substantially identical or similar to those of the above-mentioned display device according to an embodiment of the present invention will be omitted.

Figure 7:
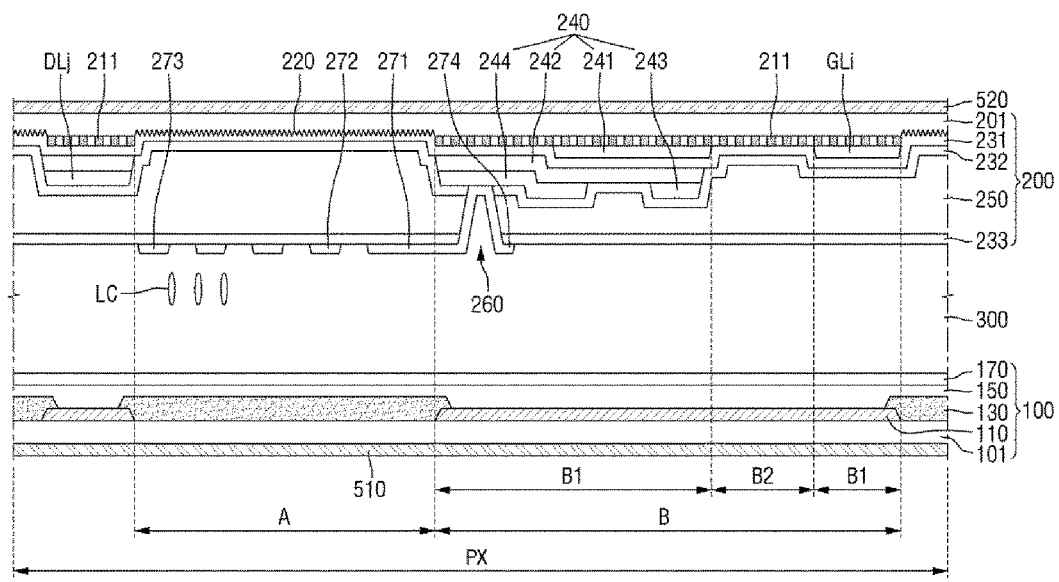
FIG. 7 is a cross-sectional view of a display device according to another exemplary embodiment of the present invention.
Figure 8:
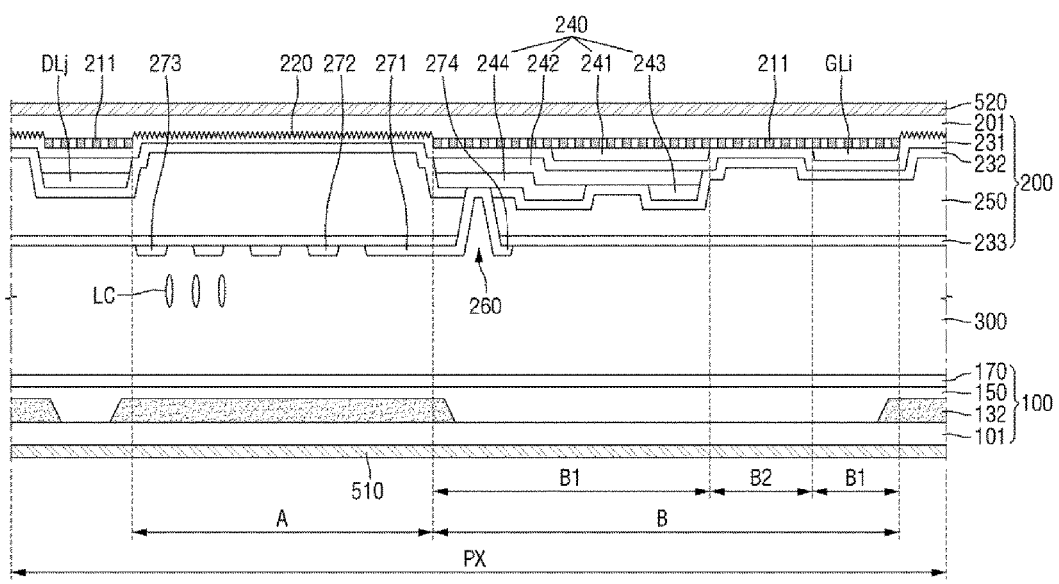
FIGS. 8 and 9 are cross-sectional views of display devices according to other exemplary embodiments of the present invention.
Figure 9:
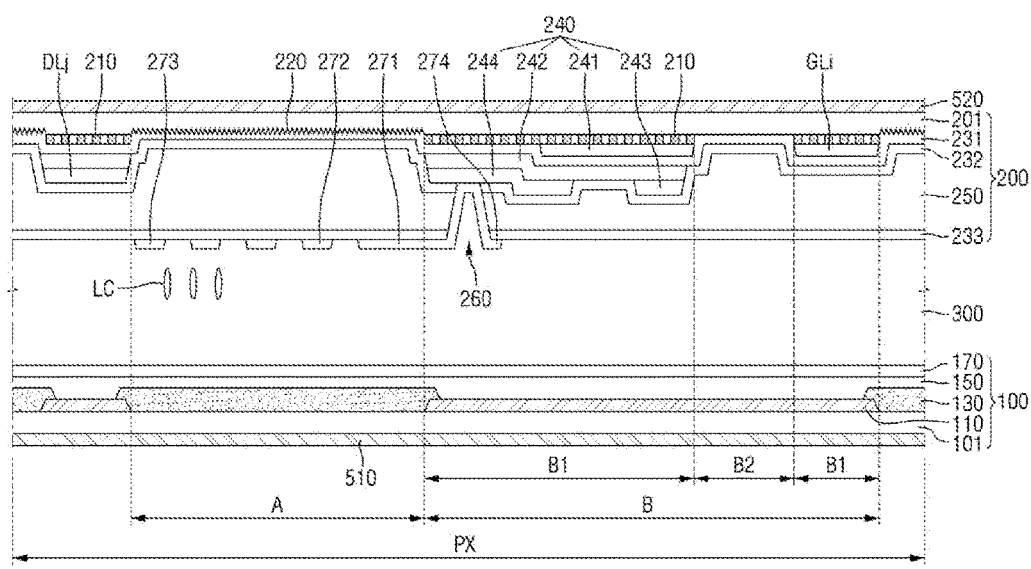

FIG. 7 is a cross-sectional view of a display device according to another exemplary embodiment of the present invention. FIGS. 8 and 9 are cross-sectional views of display devices according to other exemplary embodiments of the present invention.

Referring to FIG. 7, the display device according to another exemplary embodiment of the present invention differs from the display device of FIG. 4 in that a nano uneven pattern 220 is formed only in an opening area A, and a wire grid pattern 211 is disposed in a light-blocking area B2, in which a gate line (not shown), a data line DLj, and metal electrodes 241, 243, and 244 constituting a thin film transistor 240 are not disposed, instead of the nano uneven pattern 220 in a light-blocking area B overlapped by a light-blocking member 110. That is, the wire grid pattern 211 may be integrally formed from a metal wiring area B1 to the light-blocking area B2 in which a metal wiring is not disposed.

Because light does not substantially pass through a light-blocking area (B) masked by the light-blocking member 110, even when the wire grid pattern having a transmission axis different from that of the upper polarizing plate 520 is disposed in the light-blocking area B2, in which a metal wiring is not disposed, other than the metal wiring area B1, the decrease of transmittance is not caused, and there is an effect of further suppressing the leakage of light together with the light-blocking member 110. Further, when the wire grid pattern 211 is formed in a larger area throughout the light-blocking area B, pattern defects can be minimized, compared to when the wire grid pattern 211 is formed only in the metal wiring area B1, which is only a planar fine pattern.

Referring to FIG. 8, the display device according to still another exemplary embodiment of the present invention is different from the display device of FIG. 7 in that a light-blocking member is not provided.

As described above, because the transmission axes of the upper polarizing plate 520 and the wire grid pattern 211 are different from each other, it is possible not only to block the incidence of external light through an area in which the wire grid pattern 211 is formed (that is, light blocking area B), but also to block the light emitted from a backlight unit (not shown) in the display device to the upper side of the display panel. Therefore, it is possible to prevent the leakage of light in the light-blocking area B through the wire grid pattern 211 even though a light-blocking member is not separately formed.

Referring to FIG. 9, the display device according to still another exemplary embodiment of the present invention is different from the display device of FIG. 4 in that a nano uneven pattern 220 is formed only in an opening area A. That is, the nano uneven pattern 220 is not formed on the second base plate 201 of the light-blocking area B2, in which a gate line (not shown), a data line DLj, and metal electrodes 241, 243, and 244 constituting a thin film transistor 240 are not disposed, in the light-blocking area B overlapped by a light-blocking member 110, and a flat surface remains.

Because the light-blocking area B2 in which a metal wiring is not disposed is not provided with an additional metal layer, and its planar area is much smaller than that of the opening area A, the interface reflection through the light-blocking area B2 is barely recognized by viewers. Therefore, the wire grid pattern 210 and the nano uneven pattern 220 are formed in a minimum area, and the substrate having an area not requiring these patterns is not processed, thereby minimizing the possibility of occurrence of defects in the process.

Hereinafter, a method of manufacturing a thin film transistor substrate according to an exemplary embodiment of the present invention will be described with reference to the attached drawings.

FIGS. 10A to 10F are cross-sectional views showing a process of manufacturing a display device according to an exemplary embodiment of the present invention.

Figure 10A:
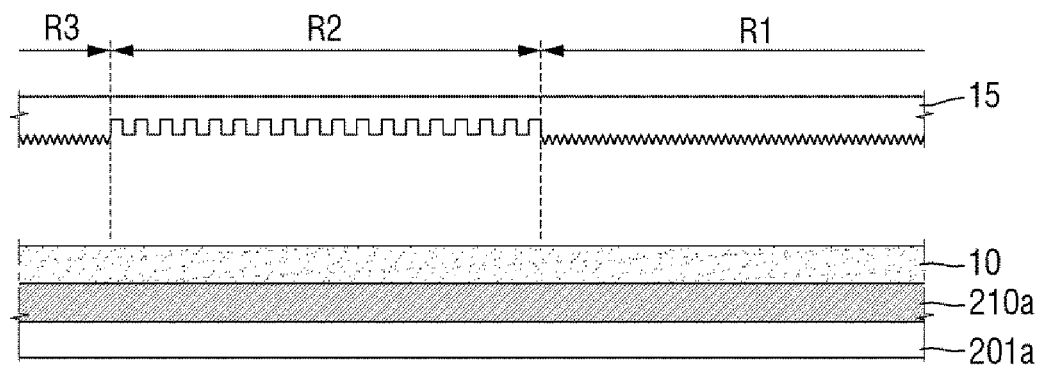
FIG. 10A, FIG. 10B, FIG. 10C, FIG. 10D, FIG. 10E, and FIG. 10F are cross-sectional views showing a process of manufacturing a display device according to an exemplary embodiment of the present invention.

Referring to FIG. 10A, first, a metal layer 210a is formed on an insulating plate 201a. The metal layer 210a may be made of any one metal material containing aluminum (Al), gold (Au), silver (Ag), copper (Cu), chromium (Cr), iron (Fe), nickel (Ni), molybdenum (Mo), and titanium (Ti); any one oxide of the metal material; or any one alloy of the metal material. Also, the metal layer 210a may be a multilayer structure in which the metal material, the oxide thereof, and the alloy thereof are laminated. The process of forming the metal layer 210a on the insulating plate 201a may be performed by chemical vapor deposition (CVD), physical vapor deposition (PVD), or sputtering, but the present invention is not limited thereto.

Next, a resin layer 10 is formed on the metal layer 210a. The resin layer 10 may be made of a UV-curable resin material. The resin layer 10 may be formed by applying the UV-curable resin material. The resin layer 10 illustrated in FIG. 10A, which is not yet cured, may have predetermined fluidity, and may be cured during or after the step of pressing a stamp 15.

Unlike what is shown in the drawings, in some exemplary embodiments, a predetermined mask layer may be interposed between the metal layer 210a and the resin layer 10. The mask layer may be made of an inorganic insulating material, such as silicon nitride, silicon oxide, or other metal oxides. Also, the mask layer may be made of a material having high etching selectivity to the meal exposed to the uppermost portion of the metal layer 210a. When the etching selectivity of the mask layer to the metal layer 210a increases, the consumption of the mask layer disposed on the metal layer 210a remaining as nanowires can be minimized while etching the metal layer 210a in order to form a wire grid pattern, and thus, it is possible to form a wire grid pattern of fine size. In consideration of specific process conditions of the mask layer, the mask layer may be a multilayer structure composed of a plurality of layers, each having different properties.

Next, a patterned stamp 15 is disposed to face the insulating plate 201a provided with the metal layer 210a and the resin layer 10. The stamp 15 may be provided on one side thereof with patterns having a reverse phase of a wire grid pattern and a nano uneven pattern to be formed.

Specifically, a first portion of a side of the stamp 15 disposed to face the first area R1 of the resin layer 10 may be provided with a reverse phase pattern of a nano uneven pattern, a second portion of the side of the stamp 15 disposed to face the second area R2 of the resin layer 10 may be provided with a reverse phase pattern of a wire grid pattern, and a third portion of the side of the stamp 15 disposed to face the third area R3 of the resin layer 10 may be provided with a reverse phase pattern of a nano uneven pattern.

Figure 10B:
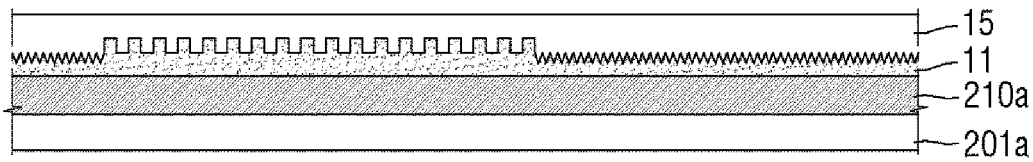
Figure 10C:
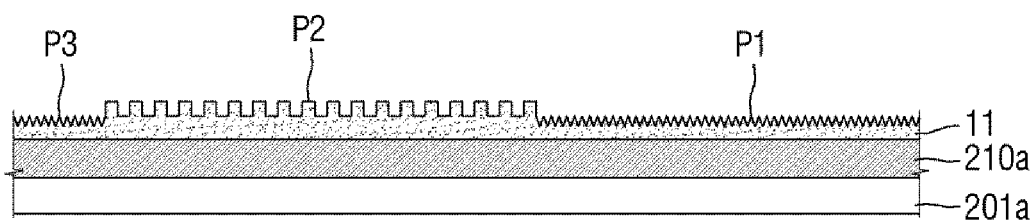

Next, referring to FIGS. 10B and 10C, an imprint process of transferring the pattern of one side of the stamp 15 to one side of the resin layer 10 by pressing the stamp 15 to one side of the resin layer 10 is performed. Specifically, a first pattern P1 having a shape corresponding to a nano uneven pattern and including a regular slope-type structure is transferred to the first area R1 of the resin layer 10, a second pattern P2 having a shape corresponding to a wire grid pattern is transferred to the second area R2 of the resin layer 10, and a third pattern P3 having a shape corresponding to a nano uneven pattern and including a regular slope-type structure is transferred to the third area R3 of the resin layer 10. The maximum height of protrusions of the second pattern P2 may be greater than the maximum height of the first pattern P1 and the third pattern P3. In this case, the uppermost portion of the patterns of the stamp 15 is pressed to be spaced apart from the surface of the metal layer 210a on the insulating plate 201a such that the uppermost portion thereof does not make contact with the surface thereof, and a residual film layer may remain between the stamp 15 and the metal layer 210a. In some exemplary embodiments, the residual film layer may not be provided.

Next, the patterned resin layer 10 is irradiated with light to form a cured resin layer 11. The light may be UV. Generally, a resin layer containing a UV-curable resin material is cured by UV irradiation. Therefore, when the fluidity of the resin layer is removed, the cured resin layer 11 can maintain the transferred pattern shape even after detaching the stamp 15, and can function as an etching mask in the subsequent etching process.

Figure 10D:
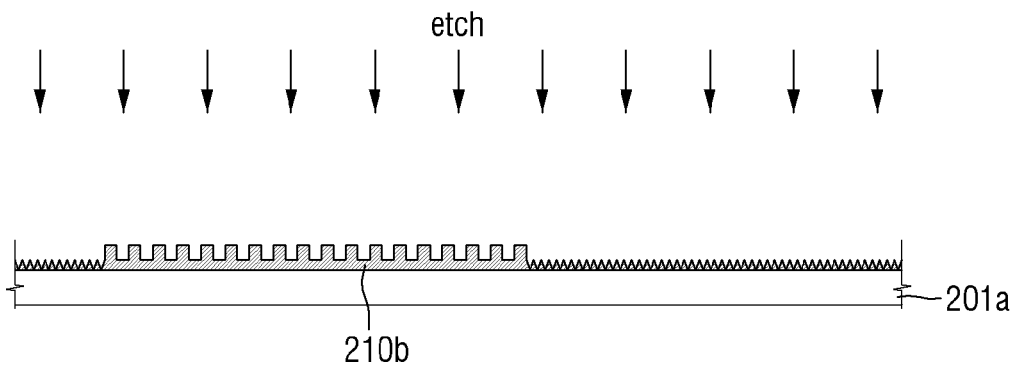

Next, referring to FIG. 10D, the cured resin layer 11 is back-etched to downsize the entire resin layer 11, so as to expose at least a part of the surface of the metal layer 210a, and then the exposed metal layer 210a is further etched using the exposed metal layer 210a as an etching mask to form an etched metal layer 210b (hereinafter, "first etching step"). In this case, the etched metal layer 210b may include a shape corresponding to a wire grid pattern and a nano uneven pattern, and at least a part of the surface of the insulating plate 201a may be exposed. In this case, the depth of the recess of the metal layer pattern corresponding to a wire grid pattern may be greater than the maximum height of the metal layer pattern corresponding to a nano uneven pattern.

Figure 10E:
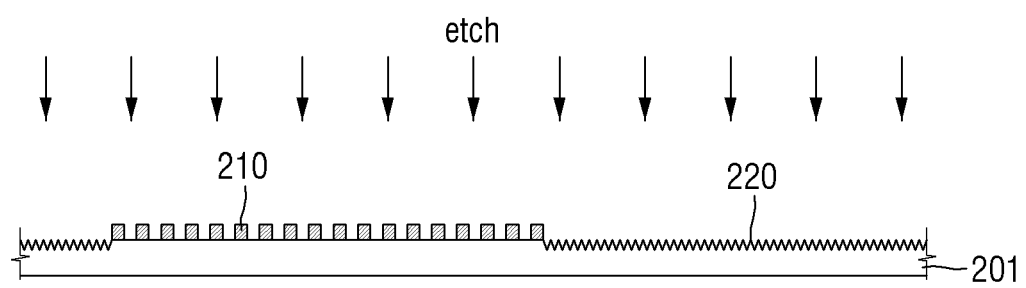

Next, referring to FIG. 10E, the metal layer pattern corresponding to a wire grid pattern is etched to form a wire grid pattern 210, and the exposed insulating plate 201a was etched using the metal layer pattern corresponding to a nano uneven pattern as an etching mask (hereinafter, "second etching step"). Through the second etching step, a base plate 201 provided on at least a part of one side thereof with the wire grid pattern 210 and the nano uneven pattern 220 may be fabricated. In some exemplary embodiments, a protection film may be further disposed on the formed wire grid pattern 210, or a groove between the wire grid pattern 210 and the nano uneven pattern 220 may be filled with a predetermined material.

The first and second etching steps may be sequentially performed while changing the process conditions, such as the kind of gas and/or plasma used in etching, etching temperature, and etching time, in consideration of materials of exposed uppermost layers and the etching ratio thereof. However, in some exemplary embodiments, the first and second steps may be substantially continuously performed without distinction.

Figure 10F:
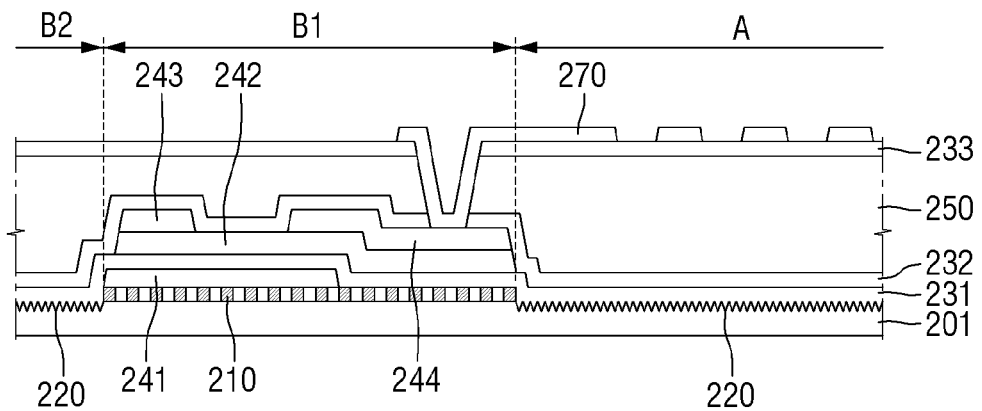

Next, referring to FIG. 10F, a gate wiring layer including a gate electrode 241 and a gate line (not shown) is disposed to overlap at least a part of the wire grid pattern 210, and then a gate insulating film 231 is formed on the nano uneven pattern 220, so as to have continuous refractive indices between interfaces in the opening area A. Next, a data wiring layer including a semiconductor layer 242, a source electrode 243, a drain electrode 244, and a data line (not shown) is disposed to overlap at least a part of the wire grid pattern 210.

The method of manufacturing a thin film transistor substrate according to exemplary embodiments of the present invention can form a plurality of different patterns in the opening area A and the light-blocking areas B1 and B2 by only a single imprint process, and the display device manufactured using the thin film transistor substrate can improve display quality by minimizing the reflection of external light.

As described above, according to exemplary embodiments of the present invention, the bending of the tape carrier package and the printed circuit board in the direction of backside of the case is minimized, and thus the volume of the drive circuit unit in the display device, thereby forming a narrow bezel.

Further, the reflection of external light in the display area of the display panel is minimized, thereby improving the contrast of the display device.

Moreover, even when a light-blocking member is not provided, light leakage occurring at the boundary between pixels in the display panel can be suppressed, thereby reducing a manufacturing cost and maximizing an opening area.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A thin film transistor substrate, comprising:
a base plate comprising a first area and a second area;
a wire grid pattern formed on one side of the base plate in the second area;
a gate electrode disposed on and overlapping the wire grid pattern; and one of a source electrode and a drain electrode disposed on the gate electrode and overlapping the wire grid pattern, wherein:

the one side surface of the base plate in the first area has a nano uneven pattern;

the nano uneven pattern comprises a same material as the base plate; and the base plate and the nano uneven pattern of the base plate are formed as an integrated structure.

2. The thin film transistor substrate of claim 1, wherein:

the one side of the base plate in the second area provided with the wire grid pattern is a flat surface; and the nano uneven pattern comprises an engraved pattern recessed toward the inner side of the base plate compared to the flat surface of the second area.

3. The thin film transistor substrate of claim 2, wherein the engraved pattern comprises a slope-type structure in which a diameter decreases toward the inner side of the base plate.

4. The thin film transistor substrate of claim 1, wherein the wire grid polarizer comprises a laminate structure of metal layers, each of the metal layers comprising:

any one metal material containing aluminum (Al), gold (Au), silver (Ag), copper (Cu), chromium (Cr), iron (Fe), nickel (Ni), molybdenum (Mo), and titanium (Ti);

any one oxide of the metal material; or any one alloy of the metal material.

5. The thin film transistor substrate of claim 1, further comprising:

a gate line disposed on and overlapping the wire grid pattern and extended in a first direction; and a data line disposed on and overlapping the wire grid pattern and extended in a second direction crossing the first direction.

6. A display device, comprising:

a first base plate comprising a pixel area comprising an opening area and a light-blocking area;

a wire grid polarizer formed on a first side of the first base plate in the light-blocking area;

a second base plate spaced apart from and facing a first side of the first base plate and having a first side and a second side;

a liquid crystal layer interposed between the first side of the first base plate and the first side of the second base plate; and a backlight unit disposed on the second side of the second base plate, wherein:

the first side surface of the first base plate in the opening area has a nano uneven pattern;

the nano uneven pattern comprises a same material as the base plate; and the base plate and the nano uneven pattern of the base plate are formed as an integrated structure.

7. The display device of claim 6, wherein:

the first side of the first base plate in the light-blocking area provided with the wire grid polarizer is a flat surface; and the nano uneven pattern comprises an engraved pattern recessed toward the inner side of the first base plate compared to the flat surface of the light-blocking area.

8. The display device of claim 7, wherein the engraved pattern comprises a slope-type structure in which a diameter decreases toward the inner side of the first base plate.

9. The display device of claim 6, wherein the wire grid polarizer comprises a laminate structure of metal layers, each of the metal layers comprising:

any one metal material containing aluminum (Al), gold (Au), silver (Ag), copper (Cu), chromium (Cr), iron (Fe), nickel (Ni), molybdenum (Mo), and titanium (Ti);

any one oxide of the metal material; or any one alloy of the metal material.

10. The display device of claim 6, further comprising a polarizing plate disposed on the second side of the first base plate and having a transmission axis direction different from the transmission axis direction of the wire grid polarizer.

11. The display device of claim 6, further comprising a nano uneven pattern formed on one side of the light-blocking area of the first base plate.

12. The display device of claim 6, further comprising a wiring layer or an electrode disposed on and overlapping the wire grid polarizer.

13. The display device of claim 1, wherein the nano uneven pattern has a dot shape in a plan view.

* * * * *